US006987390B2

(12) United States Patent
Süss et al.

(10) Patent No.: US 6,987,390 B2
(45) Date of Patent: Jan. 17, 2006

(54) METHOD FOR TESTING A TRANSFORMER AND CORRESPONDING TEST DEVICE

(75) Inventors: Franz Süss, Feldkirch-Gisingen (AT); Michael Krüger, Altach (AT); Friedrich Kaufmann, Feldkirch (AT)

(73) Assignee: Omicron Electronics GmbH, Klaus (AU)

( * ) Notice: Subject to any disclaimer, the term of this patent is extended or adjusted under 35 U.S.C. 154(b) by 77 days.

(21) Appl. No.: 10/660,330

(22) Filed: Sep. 11, 2003

(65) Prior Publication Data

US 2004/0130329 A1    Jul. 8, 2004

(30) Foreign Application Priority Data

Sep. 11, 2002    (EP)    ................................ 02020424

(51) Int. Cl.
*G01R 31/06*    (2006.01)
*G01R 29/20*    (2006.01)
*G01R 33/14*    (2006.01)
*G06G 7/62*    (2006.01)

(52) U.S. Cl. ...................... 324/547; 324/726; 324/222; 703/13

(58) Field of Classification Search ................ 324/547, 324/713, 222; 703/13, 14, 18
See application file for complete search history.

(56) References Cited

U.S. PATENT DOCUMENTS 5,500,598 A * 3/1996 Ford ........................... 324/547

5,781,764 A * 7/1998 Degeneff et al. ............... 703/2

(Continued)

FOREIGN PATENT DOCUMENTS

EP    0 600 726 B1    3/2000

OTHER PUBLICATIONS

Tellinen, Juhani "A Simple Scalor Model for Manetic Hysteresis", IEEE Transactions on Magnetics, vol. 34, No. 4, Jul. 1998.*

(Continued)

*Primary Examiner*—Anjan Deb
*Assistant Examiner*—Jeff Natalini
(74) *Attorney, Agent, or Firm*—McDonnell Boehnen Hulbert & Berghoff LLP

(57) ABSTRACT

Testing a transformer by applying to the transformer a test signal, the frequency of which may be lower than the nominal frequency of the transformer. The voltage of the test signal may also be lower than the nominal voltage of the transformer. A number of frequency-dependent parameters are measured, particularly the eddy current resistance and the hysteresis curve of the transformer, in order to derive a simulation model which simulates the behavior of the transformer at different frequencies. Using this simulation model, it is possible to predict operating parameters of the transformer, such as the terminal voltage on the secondary and the terminal current in the secondary, during operation with a frequency deviating from the frequency of the test signal, particularly during operation with the nominal frequency of the transformer.

21 Claims, 1 Drawing Sheet

U.S. PATENT DOCUMENTS

| | | | | |
|---|---|---|---|---|
| 6,072,310 | A | * | 6/2000 | Krebs et al. ............. 324/117 R |
| 6,321,169 | B1 | | 11/2001 | Iwao ............................ 702/65 |
| 6,396,279 | B1 | * | 5/2002 | Gruenert ...................... 324/424 |
| 6,754,616 | B1 | * | 6/2004 | Sen et al. ...................... 703/13 |
| 2001/0038290 | A1 | | 11/2001 | Coffeen ....................... 324/547 |
| 2002/0161558 | A1 | * | 10/2002 | Georges et al. ............. 702/189 |

OTHER PUBLICATIONS

Semiyen et al. "Eddy current add-on for frequency...", IEE ProcGener. vol. 141, No. 3, May 1994.*

Datasheet for Relaying Current Transformer Analyzer (CTERP-2000). Eltel Industries. West onsale in early 2002. 2pages. ☐☐.*

International Electrotehnical Commission, *International Standard*, "Instrument transformers, Part 6: Requirements for protective current transformers for transient performance," 1st Ed., 1992, p. 1-88.

Letter from Oleh W. Iwanusiw, P.Eng. dated Feb. 18, 2005. "Relaying Current Transformer Analyzer", Ethel Industries Jul. 25, 2000.

* cited by examiner

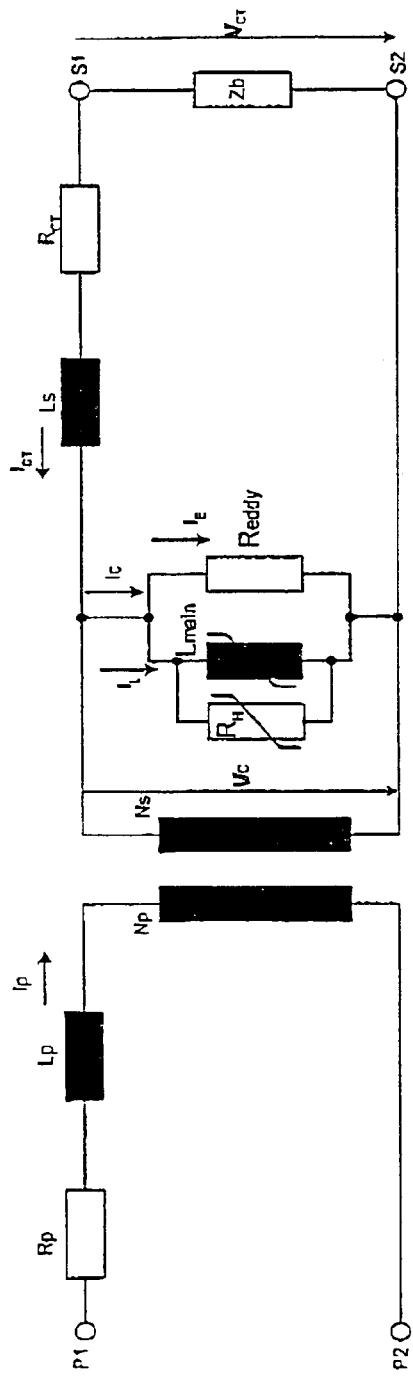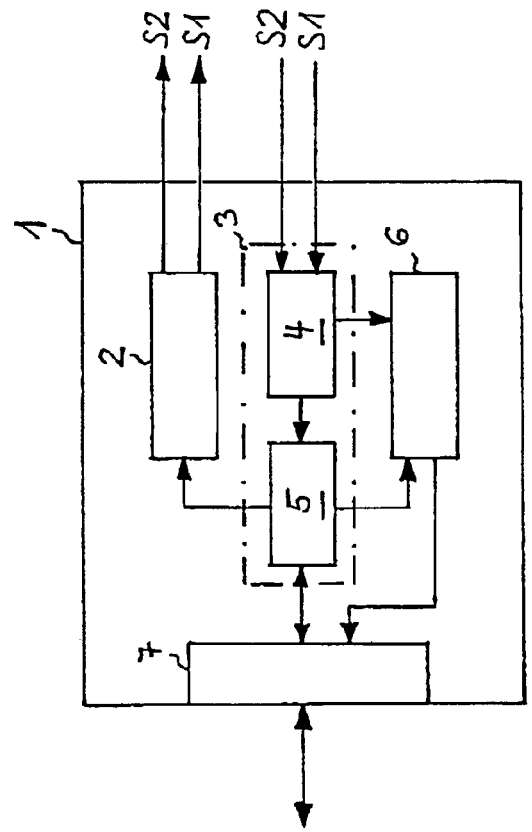

METHOD FOR TESTING A TRANSFORMER AND CORRESPONDING TEST DEVICE

REFERENCE TO RELATED APPLICATIONS

This application claims priority to European Patent Application No. EP02020424.4, filed Sep. 11, 2002, the entirety of which is hereby incorporated by reference.

FIELD OF THE INVENTION

The present invention relates to a method and to a correspondingly constructed test device for testing a transformer. In particular, the present invention is suitable for testing instrument transformers, and especially for testing current transformers.

BACKGROUND

According to the IEC 60044-6 Standard, the following requirements must be tested in instrument transformers:
1. Turns ratio error
2. Ratio error and phase angle error in the steady state
3. Winding resistance of the secondary winding
4. Magnetization characteristics
5. Remanence factor
6. Time constant of the secondary circuit
7. Errors in boundary conditions
8. Verification of the design for low leakage flux Test instruments which have been on the market to date use an variable transformer (Variac) connected directly to the low-voltage mains, which generates a sinusoidal signal at mains frequency as the test signal for the instrument transformer to be tested in each case. These conventional devices can be used for generating on the secondary side of the instrument transformer voltages and currents which also occur in nominal operation. To test most of the conventional instrument transformers, therefore, these test instruments must have a signal source with an apparent power of up to 5 kW. For some instrument transformers, voltages of up to 4 kV are needed and others need currents of up to 5 A. The test instruments on the market are, therefore, either very heavy due to their high output power or they can only test instrument transformers with low apparent powers so that they can only be used to a limited extent.

Although the IEC 60044-6 Standard describes test methods in which test signals with reduced test frequency or test voltage are used for testing the respective instrument transformer, these test methods are very inaccurate overall since the altered behavior of instrument transformers during an operation deviating from the nominal or mains frequency is not taken into consideration.

This problem relates not only to the testing of instrument transformers (current or voltage transformers) but generally to the testing of all transformers.

DETAILED DESCRIPTION

The present method and system provides a method for testing a transformer, particularly an instrument transformer, especially a current transformer, and a correspondingly constructed test device, by means of which the aforementioned problems can be eliminated so that a reliable test of the transformer is possible even when a signal source with relatively low output power is used for generating the test signal.

For testing a transformer according to the method, particularly an instrument transformer, in order to measure a number of frequency-dependent parameters of the transformer, it is possible to apply a test signal with a frequency that is lower than the nominal or operating frequency of the transformer. From the parameters measured by means of this test signal, a simulation model is derived which enables the behavior of the transformer at different frequencies to be simulated. Using this simulation model, or using the parameters measured by means of the test signal, it is then possible to infer the behavior of the transformer during operation with a frequency deviating from the frequency of the test signal, particularly the behavior of the transformer during operation at its nominal frequency.

The simulation model, which is determined with the aid of the test signal, takes into consideration frequency- and/or voltage-dependent parameters of the transformer, particularly the main inductance, hysteresis losses, eddy current losses and the resistance of the secondary winding of the transformer. For this purpose, the test signal is in each case fed into the secondary of the transformer to be tested and the parameters of the transformer which then occur are measured on the secondary side. Thus, for example, it is possible to measure the resistance of the secondary winding by feeding a direct current test signal into the secondary of the transformer and then measuring the voltage which can then be picked up across the connecting terminals on the secondary in order to determine the resistance of the secondary winding. The eddy current losses of the transformer can be measured by a number of measurements with identical magnetic flux but with different frequencies in each case, particularly with two different frequencies, and the power dissipation can then be determined in each case from the instantaneous current and voltage values at the secondary of the transformer. The power dissipation obtained in this manner can be split into the hysteresis losses and the eddy current losses of the transformer. To determine the hysteresis losses of the transformer, the magnetization or hysteresis curve of the transformer can be measured using a periodic test signal applied to the secondary of the transformer in order to determine from the resultant voltage and current values and the eddy current losses determined in the aforementioned manner the voltage and current variation on the main inductance of the transformer. Using a controllable signal source makes it possible to calculate automatically in the same test run the winding resistance and the current/voltage transfer characteristic and the hysteresis curve for an arbitrary frequency and an arbitrary signal shape.

From the aforementioned parameters of the transformer, the simulation model is determined with the aid of which the current and voltage variation at the connecting terminals of the transformer can be derived at an arbitrary operating frequency and with an arbitrary load, i.e., the simulation model can be used for simulating the transfer characteristic of the instrument transformer even at high frequencies or harmonics.

The present invention may be used for testing instrument transformers, particularly current transformers. Naturally, however, the present invention is not restricted to this preferred field of application but can be used generally for testing any transformers.

When using the method, it is not necessary to use a test signal of a particular frequency or of a particular voltage for reliably testing the transformer. Instead, a test signal with variable frequency and variable voltage may be used. Accordingly, the method does not require the use of an efficient sinusoidal voltage source with high output power for generating the test signal; instead, it is possible to test virtually any transformer or instrument transformer with a low-power signal source, particularly with a very weak signal source. The test is not performed at the nominal frequency of the transformer but with a test signal having a lower frequency than the nominal frequency of the transformer. In addition, the voltage of the test signal can be distinctly lower than the test voltage of conventional test instruments. Thus, in particular, a test signal can be used, the voltage of which is much lower than the voltage value which would be necessary for measuring the so-called knee point of the transformer at the nominal frequency of the transformer. In particular, the test signal is of such a nature that it produces the same magnetic flux as a test signal with the nominal frequency of the transformer in the magnetic core of the transformer.

Thus, all existing transformers or instrument transformers can be reliably tested with the aid of the present method and apparatus. The measurements proposed herein and consequently known model parameters can be used for measuring a multiplicity of different quantities, wherein it is possible to measure or calculate, among other things, the turns ratio error, the ratio error and phase angle error (phase displacement) in the steady state, the composite error, the remanence factor and the error at boundary conditions.

The test instrument used can be constructed to be of very light weight, particularly in the form of a portable instrument, due to its very low output power. Since only a low power output needs to be produced and because the transformer can be tested with a non-sinusoidal test signal, the manufacturing costs associated with the test instrument are also very low. In principle, it is cheaper to generate a square-wave test signal than a sinusoidal test signal. The test of the respective transformer may be automated so that reproducible test results can be achieved. Since the measured simulation model of the transformer is used in the process, the behavior of the transformer can be simulated under different loading without requiring a high-power signal source. By calculating back from the measurement results thus obtained to the nominal frequency of the transformer, the operator obtains the behavior of the transformer actually occurring during the application since the measurement results represent the voltages and currents actually occurring on the transformer.

In the text which follows, the present invention will be explained in greater detail by means of an exemplary embodiment and referring to the attached drawing.

In the sole FIGURE, an equivalent circuit of a transformer or instrument transformer to be tested is shown.

P1, P2 here designate connecting terminals on the primary and S1, S2 designate connecting terminals on the secondary of the instrument transformer. Np and Ns designate the primary and secondary number of turns, respectively, of the (ideal) instrument transformer and Rp and Lp denote the resistance and the leakage inductance, respectively, of the primary winding and $R_{ct}$ and Ls denote the resistance and the leakage inductance, respectively, of the secondary winding of the instrument transformer. $R_H$ corresponds to the hysteresis losses of the instrument transformer and $R_{eddy}$ designates the eddy current resistance of the instrument transformer for modeling the eddy current losses. $L_{main}$ designates the main inductance of the instrument transformer. The main inductance $L_{main}$ and the hysteresis losses $R_H$ of the instrument transformer are modeled with the hysteresis loop of the instrument transformer, as will be explained in more detail in the text which follows. $Z_b$ designates the impedance of the load of the instrument transformer at nominal frequency. $I_p$ designates the current flowing via the connecting terminals on the primary and $I_{ct}$ designates the current flowing via the connecting terminals on the secondary. The voltage across the connecting terminals on the secondary is designated by $V_{CT}$. $V_c$ denotes the voltage present across the main inductance of the instrument transformer and the current flowing via the parallel circuit of $R_H$, $L_{main}$ and $R_{eddy}$ is designated by $I_c$ and, according to the FIGURE, is divided into a current $I_E$ flowing via the eddy current resistance $R_{eddy}$ and a current $I_L$ flowing via the parallel circuit of $R_H$ and $L_{main}$.

When voltages and currents are stated in the text which follows, the corresponding instantaneous values are always meant unless reference is expressly made to the rms value by the index "rms".

It is known that the so-called interlinked flux $\psi$ depends on the voltage-time integral, that is to say the voltage integral over time, at the connecting terminals on the secondary of the instrument transformer. Accordingly, using $\psi_0$ as a constant, the following applies:

$$\psi(t) = \int_0^t [V_{CT}(t) - R_{CT} \cdot I_{CT}(t)] dt + \psi_0 \qquad (1)$$

If only a test signal with a relatively low frequency is used for testing the instrument transformer, more or less large measurement errors, depending on the type of transformer, are produced by the behavior of the magnetic or iron core of the instrument transformer which deviates at the low test frequency. Accordingly, only a very inaccurate behavior can be predicted at the nominal frequency of the instrument transformer if the frequency-dependent behavior of the iron core during a test of the instrument transformer at low test frequency is not taken into consideration. To obtain accurate measurement results, therefore, a simulation model of the instrument transformer to be tested is defined which allows the frequency-dependent behavior of the instrument transformer to be described with the aid of a few parameters. This simulation model is kept as simple as possible so that, on the one hand, no elaborate measurements are necessary for determining these parameters and, on the other hand, the subsequent calculations for deducing the behavior of the instrument transformer during operation at the nominal frequency do not require much time.

The resistance Rp of the primary winding and the primary leakage inductance Lp do not play a role in testing the instrument transformer and, therefore, do not need to be measured either. The secondary leakage inductance Ls can only be determined with a relatively large effort, since, in general, it only plays a subordinate role for the concluding measurement result, it will also be neglected in the text which follows.

The equivalent circuit of an instrument transformer, shown in the sole FIGURE, largely corresponds to a conventional equivalent circuit. As mentioned above, however, in contrast to the conventional equivalent circuit, the main inductance $L_{main}$ is not simply assumed to be a linear inductance with an equivalent iron loss resistance but instead a nonlinear inductance which is described with the aid of a frequency-dependent hysteresis curve for periodic signals. The iron core of the instrument transformer is, therefore, modeled with the aid of the nonlinear main inductance $L_{main}$ which describes the nonlinear behavior of the iron core without hysteresis (that is to say, lossless), the hysteresis loss resistance $R_H$ which describes the hysteresis losses and is also nonlinear, and the linear eddy current resistance $R_{eddy}$ which takes into consideration the eddy current losses in the iron core.

The nonlinear main inductance $L_{main}$ and the hysteresis loss resistance $R_H$ are described together with the aid of a frequency-independent hysteresis curve. This hysteresis curve is traced periodically with respect to time but the shape does not depend on the rate of change and is thus also independent of the shape of the curve of the measurement quantities with time. However, the hysteresis curve does depend on the drive to the instrument transformer and is differently shaped depending on the signal amplitude. The maximum interlinked flux $\psi_{max}$ is used as the relevant parameter.

The winding resistances $R_p$ and $R_s$ and the leakage inductances $L_p$ and $L_s$ are described in the equivalent circuit shown in the FIGURE as in the conventional or traditional equivalent circuit of a transformer.

Apart from the equivalent circuit of the instrument transformer to be tested, the FIGURE also shows an exemplary embodiment of a test instrument 1 according to the invention which, in particular, is constructed in the form of a portable test instrument.

The test instrument 1 may include a controllable signal source 2, a control unit 3 with a measuring device 4 and an evaluation and control device 5, a memory 6 for storing measurement results and an interface 7 for bi-directional communication with an external device, for example an external computer, in order to receive from this external device control signals for the automatic control of the test sequence performed by the test instrument 1 or to transmit test or measurement results to this external device.

The control unit 3, which also handles the function of a data processing unit, can be constructed in the form of a controller and/or computer and/or digital signal processor. The control unit 3 generates, as a function of a predetermined test sequence, control signals for the controllable signal source 2 via the control and evaluation device 5 in order to apply a test signal of predetermined frequency and/or voltage to the connecting terminals S1, S2 on the secondary of the instrument transformer to be tested. Furthermore, the test instrument has a number of test inputs, only one test input of which is shown by way of example in the FIGURE, in order to supply test signals, picked up by the connecting terminals S1, S2 on the secondary of the instrument transformer, to the measuring device 4 of the control unit 3 in order to determine by this means various frequency- and also voltage-dependent parameters of the instrument transformer to be tested which are subsequently evaluated by the control and evaluation device 5 in order to derive from these the aforementioned simulation model which enables the control and evaluation device to deduce the actual behavior of the instrument transformer to be tested at arbitrary frequencies and loads $Z_b$, particularly also at the nominal or operating frequency actually provided for the instrument transformer.

The measurement results detected by the measuring device 4 and/or the simulation model derived therefrom by the control and evaluation device 5 can be temporarily stored in the memory 6 for later access. In this manner, the measurement and test results can also be filed and logged in the form of a test report and output via an output unit (not shown in the drawing), for example, a screen or a printer. The control unit 3 (or, respectively, the control and evaluation device 5 contained therein) controls the test sequence of the instrument transformer, performed by the test instrument 1, fully automatically, that is to say, for testing the various parameters of the instrument transformer which form the basis for the simulation model, various test signals are automatically applied via the controllable signal source 2 to the secondary of the instrument transformer to be tested without requiring any intermediate intervention by an operator. The test sequence can be performed in correspondence with a stored program code (software). It is also conceivable that—as has already been mentioned—the test sequence is controlled via the interface 7 with the aid of an external device. The controllable signal source 2 may be a signal source controlled to a predetermined value, which is thus independent of mains fluctuations.

One of the parameters of the instrument transformer which are detected by the measuring device 4 of the test instrument 1 for the subsequent determination of the simulation model of the instrument transformer, is the resistance $R_{ct}$ of the secondary winding of the instrument transformer. For this purpose, the controllable signal source 2 is activated in such a manner that it applies a direct current to the connecting terminals S1, S2 on the secondary. The measuring device 4 can then measure the resistance $R_{ct}$ of the instrument transformer by detecting the current and the voltage at the connecting terminals on the secondary. In principle, due to the skin effect and the proximity effect (current displacement), the resistance $R_{ct}$ of the secondary winding during operation of the instrument transformer at the nominal frequency differs from the measured resistance value occurring when the secondary of the instrument transformer is operated with direct current or direct voltage. However, these differences are generally so small that these effects can be neglected.

Since the modeling of the iron core of the instrument transformer is of particular significance for the test of the instrument transformer, care must be taken that the modeling is as precise as possible in this respect. The behavior of the iron core of the instrument transformer can be described with the aid of the hysteresis curve which specifies the behavior between the magnetic excitation H and the magnetic flux density B when the iron core is excited with a periodic signal. It is found that the shape of the hysteresis curve depends on the frequency of the periodic excitation. The reason for this is mainly the eddy currents in the iron core. Due to the changing magnetic flux density, electric eddy fields are produced in the iron core (law of induction) which generate eddy currents due to the conductivity of the iron. The effect caused by the secondary winding of the instrument transformer is equivalent to an additional winding on the iron core which is loaded with a resistance. It is thus possible to model the eddy current losses with a linear resistance $R_{eddy}$, as is also indicated in the FIGURE. To determine this resistance $R_{eddy}$, the hysteresis losses and the eddy current losses must first be separated.

In the iron core, only the total losses can be measured. For this purpose, the signal source 2 is driven in such a manner that a periodic voltage is applied to the secondary winding of the instrument transformer and the power absorbed by the instrument transformer is determined when the primary of the instrument transformer is operated as an open circuit. Some of the power absorbed by the instrument transformer is lost in the secondary winding of the instrument transformer, and the remaining power is lost in the iron core. The test signal generated for this measurement by the signal source 2 can be, in particular, a non-sinusoidal test signal, for example a square-wave signal, so that the signal source 2 can also be constructed in a particularly inexpensive manner as an alternately polarized voltage source.

The losses are divided into hysteresis losses and eddy current losses on the basis of the different behavior with respect to the excitation frequency, assuming equal maximum flux density.

The hysteresis losses increase proportionally with the frequency whereas the eddy current losses increase as the square of the frequency. The total loss $P_T$, the hysteresis loss $P_H$ and the eddy current loss can thus be described as a function of the frequency, as follows:

$$P_T(f) = P_H + P_E \qquad (2)$$
$$P_H(f) = \alpha \cdot f$$
$$P_E(f) = \beta \cdot f^2$$

A separation of the hysteresis losses and of the eddy current losses can be achieved with two measurements at different excitation frequencies. Since two measurements at a different frequency are performed with an identical maximum flux density, the iron losses P1 and P2, measured at the two frequencies $f_1$ and $f_2$, can be calculated as a function of the factors $\alpha$ and $\beta$, as follows:

$$P_1 = \alpha \cdot f_1 + \beta \cdot f_1^2 \qquad (3)$$
$$P_2 = \alpha \cdot f_2 + \beta \cdot f_2^2$$

The factors $\alpha$ and $\beta$ can thus be determined as follows:

$$\alpha = \frac{P_1 \cdot f_2^2 - P_2 \cdot f_1^2}{f_1 \cdot f_2 \cdot (f_2 - f_1)} \qquad (4)$$
$$\beta = \frac{P_2 \cdot f_1 - P_1 \cdot f_2}{f_1 \cdot f_2 \cdot (f_2 - f_1)}$$

The eddy current resistance $R_{eddy}$ can then be calculated as a function of the excitation frequencies $f_1$ and $f_2$, the factor $\beta$, now known, and the rms values $V_{crms1}$, $V_{crms2}$ of the voltage $V_c$ at the two measurements with the frequencies $f_1$ and $f_2$, as follows:

$$R_{eddy} = \frac{Vc_{rms1}^2}{\beta \cdot f_1^2} = \frac{Vc_{rms2}^2}{\beta \cdot f_2^2} \qquad (5)$$

Assuming the same maximum flux in the iron core, the eddy current losses initially increase with $f^2$ but only with $f^{1.5}$ at higher frequencies. The transition from the first rule to the second rule depends on the conductivity of the material, the magnetic permeability and the thickness of the iron laminations of the instrument transformer. The thickness of the laminations of the iron core is always dimensioned in such a manner that only little flux displacement occurs at the nominal frequency of the instrument transformer in order to keep the losses low. The boundary between the two rules is thus at a frequency which is clearly above the nominal frequency of the instrument transformer. With the measurements performed here, a quadratic relationship between the eddy current losses and the frequency can thus be assumed with good accuracy.

As a further parameter of the instrument transformer to be tested, the hysteresis curve of the instrument transformer is measured. The hysteresis curve is used for modeling the hysteresis losses $R_H$ and the main inductance $L_{main}$ of the instrument transformer.

To measure the hysteresis curve, the signal source 2 is driven by the control unit 3 or the control and evaluating device 5 contained therein, in such a manner that a periodic and possibly again nonsinusoidal test signal is applied to the connecting terminals S1, S2 on a secondary of the instrument transformer. The measuring device 4 measures the current and voltage values then occurring at the connecting terminals on the secondary so that the control and evaluating device 5 can infer the voltage and current variation, that is to say the quantities $V_c$ and $I_L$ at the main inductance of the instrument transformer from the current and voltage values measured by the measuring device 4 and the eddy current resistance previously determined. The test signal generated by the signal source 2 may have a frequency which is different from the nominal frequency of the instrument transformer and, in particular, distinctly lower.

Neglecting the leakage inductance of the instrument transformer, the voltage $V_c$ and the current $I_L$ of the main inductance can be determined from the current and voltage values $V_{ct}$ and $I_{ct}$ measured by the measuring device 4 at the connecting terminals on the secondary of the instrument transformer and the eddy current resistance $R_{eddy}$ previously determined, as follows:

$$V_c = V_{ct} - R_{ct} \cdot I_{ct} \qquad (6)$$
$$I_L = I_{ct} - \frac{Vc}{Reddy}$$

Using the voltage variation $V_c(t)$ with time, the interlink flux $\psi(t)$ can be calculated in correspondence with the above formula (1). The constant $\psi_0$ is determined in such a manner that the mean value of the interlink flux is 0 so that offset correction is provided.

The relationship between the time $I_L(t)$ and the interlink flux $\psi(t)$ is called the hysteresis curve and is a parametric representation between the current $I_L(t)$, which is proportional to the magnetic excitation H, and the interlink flux $\psi(t)$ which is proportional to the magnetic flux density B, the parameter of this function representation being time t. Since the eddy current losses have already been taken into consideration in the current $I_L(t)$, this hysteresis curve is largely independent of frequency.

The parametric representation obtained in this manner can be transformed into a time-independent parametric representation if a time-independent parameter p is introduced:

$$\psi_H(p) = \psi(t) \qquad (7)$$
$$I_H(p) = I_L(t)$$
$$p = \frac{t}{T}$$

where T is the duration of the period in the measurement of the hysteresis curve and $\psi_H$ is the magnetic flux dependent on the time-independent parameter p, which is located in the interval [0,1], and $I_H$ is the current, dependent on the time-independent parameter p, through the main inductance of the instrument transformer.

Using the above parametric representation, the behavior of the iron core can be determined for a particular maximum interlink flux $\psi_{max}$, the behavior being independent of the variation of the test signal with time. It is only assumed that the iron core is periodically excited with the aid of the test signal and the same maximum interlink flux $\psi_{max}$ is achieved.

If it is intended to determine the behavior of the instrument transformer with different drives, a separate hysteresis curve must be determined in each case for each drive and the mathematical simulation model then applies precisely to this drive. In principle, therefore, a complete description of the instrument transformer requires a family of hysteresis curves and each hysteresis curve can be characterized with the maximum interlink flux.

Using the measurement quantities of the instrument transformer to be tested, measured in the aforementioned manner by the measuring device 4 of the test instrument 1, a mathematical simulation model of the instrument transformer can be formed, the parameters of which are the measured measurement quantities. Using this simulation model, the behavior of the instrument transformer with different loading and, in particular, with an operating frequency deviating from the frequency of the test signal and also with an operation of the instrument transformer with a voltage having a different shape than the test signal can be determined.

In principle, it is possible to precisely determine the variation of the interlink flux in the iron core of the instrument transformer if a sinusoidal voltage is given at the terminals of the instrument transformer (e.g. with harmonic balance). However, the computing effort required for this is relatively high so that the aim is a simplified method which will be described in the text which follows.

As a starting point for this simplified method, a sinusoidal or cosinusoidal variation of the interlink flux at the nominal frequency $f_N$ of the instrument transformer is used:

$$\psi(t) = -\psi_{max} \cdot \cos(2\pi f_N t) \tag{8}$$

This provides an induced voltage $V_c$ in the secondary winding of the instrument transformer as a function of the nominal frequency $f_N$ and the maximum interlink flux $\psi_{max}$, as follows:

$$V_c = 2\pi f_N \cdot \psi_{max} \cdot \sin(2\pi f_N t) \tag{9}$$

Thus, the interlink flux $\psi(t)$ can be specified for any time t and the parametric representation of the hysteresis curve can be used for determining the time-independent parameter p precisely for this time t in order to determine from this the current $I_L(t)$ for this time (compare the above formulae (1) and (7)). This makes it possible to specify the variation of the current $I_L(t)$ with time precisely.

Using Kirchhoff's rules, the secondary terminal current $I_{ct}$ and the secondary terminal voltage $V_{ct}$ of the instrument transformer can be determined on the basis of the quantities $I_L$, $V_c$ and $R_{eddy}$, which are now known, as follows:

$$I_{ct} = I_L + \frac{V_c}{R_{eddy}} \tag{10}$$

$$V_{ct} = V_c + I_{ct} \cdot R_{ct}.$$

The variation of the terminal voltage $V_{ct}(t)$ with time is no longer precisely sinusoidal since the current has severe distortions and a voltage proportional thereto is dropped across the resistance $R_{ct}$. In general, the deviation from the sinusoidal shape is very small since the winding resistance of the instrument transformer is generally very small.

Usually, in the type of test representation designated as "CT excitation curve" by the applicant, the relationship between the rms value of the current $I_{ct}$ and of the voltage $V_{ct}$ on the secondary of the instrument transformer is represented with an open primary winding. In the case where the voltage $V_{ct}$ does not have a sinusoidal variation, a corrected rectified value can be used instead of the rms value, the sine-wave form factor being used as the correction factor:

$$V'_{CT} = \frac{\pi}{T\sqrt{8}} \int_0^T |V_{CT}(t)| dt \tag{11}$$

$$I'_{CT} = \sqrt{\frac{1}{T} \int_0^T I_{CT}^2(t) dt} \quad \text{(Representation of the current as rms value according to the IEC 60044-1 standard)}$$

$$I'_{CT} = \max |I_{CT}(t)| \quad \text{(Representation of the current as a peak value according to the IEC 60044-6 standard)}$$

$V_{ct}'$ and $I_{ct}'$ designate the respective corrected value of the terminal voltage on the secondary and the terminal current in the secondary. Using the measure described above, the same maximum flux can be essentially achieved independently of the shape of the curve.

Thus, it is possible to obtain in each case one point on this CT (current transformer) excitation curve from one hysteresis curve. A correspondingly large number of hysteresis curves must be determined to obtain the complete excitation curve.

Finally, it should be pointed out that the calculation methods specified above are only intended as examples and, in particular, a refinement of these calculation methods is also possible.

We claim:

1. A method for testing a transformer using a test signal having a particular frequency, the method comprising:
   measuring a plurality of parameters of the transformer when the transformer is excited by applying a periodic test signal at different frequencies to a secondary of the transformer, wherein eddy current resistance of the transformer is one of the parameters of the transformer;
   deriving a simulation model for the transformer using the plurality of measured parameters, the simulation model representing operating parameters at a plurality of frequencies other than the particular frequency of the test signal; and
   deriving the eddy current resistance by measuring power absorbed by the secondary of the transformer when the test signal is applied.

2. The method of claim 1, wherein the frequency of the test signal is lower than the nominal frequency of the transformer, and wherein the behavior of the transformer when it is operated at the nominal frequency is determined with the aid of the simulation model.

3. The method of claim 1, wherein the test signal is applied to the secondary of the transformer, and wherein the parameters of the transformer are measured at the secondary of the transformer.

4. The method of claim 1, wherein the test signal is applied to the transformer with a voltage that is lower than the voltage required for measuring the knee point when the transformer is operated at the nominal frequency.

5. The method of claim 1, wherein the test signal is used for measuring a plurality of frequency dependent, voltage dependent, or frequency and voltage dependent parameters of the transformer in order to derive the simulation model.

6. The method of claim 1, wherein the resistance of a secondary winding of the transformer is one of the parameters, wherein a direct-current signal is applied as the test signal to the secondary of the transformer and wherein the voltage produced across the secondary of the transformer and the current flowing through the secondary of the transformer are measured in order to derive the resistance of the secondary winding.

7. The method of claim 1, wherein, to derive the eddy current resistance of the transformer, two measurements are performed at two different frequencies $f_1$ and $f_2$ and the power $P_1$ and $P_2$ absorbed by the transformer during the two measurements is measured, wherein the following equations are satisfied:

$$P_1 = \alpha \cdot f_1 + \beta \cdot f_1^2$$

$$P_2 = \alpha \cdot f_2 + \beta \cdot f_2^2$$

where the factors $\alpha$ and $\beta$ are determined as a function of the frequencies $f_1$ and $f_2$ and on the powers $P_1$ and $P_2$, as follows:

$$\alpha = \frac{P_1 \cdot f_2^2 - P_2 \cdot f_1^2}{f_1 \cdot f_2 \cdot (f_2 - f_1)}$$

$$\beta = \frac{P_2 \cdot f_1 - P_1 \cdot f_2}{f_1 \cdot f_2 \cdot (f_2 - f_1)}$$

in order to derive the eddy current resistance.

8. The method of claim 7, wherein the eddy current resistance $R_{eddy}$ is determined via the following relation;

$$R_{eddy} = \frac{Vc_{rms1}^2}{\beta \cdot f_1^2} = \frac{Vc_{rms2}^2}{\beta \cdot f_2^2}$$

where $Vc_{rms1}$ designates the rms value of the voltage at the main inductance of the transformer during the measurement with the frequency $f_1$ and $Vc_{rms2}$ designates the rms value of the voltage at the main inductance of the transformer during the measurement with the frequency $f_2$.

9. The method of claim 1, wherein the plurality of parameters comprises a hysteresis curve of the transformer, the method further comprising:

applying a periodic signal to the secondary of the transformer;

measuring resulting current and voltage values at the secondary;

deriving, from the plurality of parameters, a voltage and current variation on the main inductance of the transformer as a function of an eddy current resistance of the transformer, in order to determine the hysteresis curve.

10. The method of claim 9, wherein the voltage $V_c$ and the current $I_L$ on the main inductance of the transformer are derived from the voltage $V_{ct}$ measured at the secondary of the transformer, a current $I_{ct}$ measured at the secondary, the resistance $R_{ct}$ of the secondary winding of the transformer and the eddy current resistance $R_{eddy}$, as follows:

$$V_c = V_{ct} - R_{ct} \cdot I_{ct}$$

$$I_L = I_{ct} - \frac{Vc}{R_{eddy}}.$$

11. The method of claim 1, wherein the operating parameters of the transformer during operation with a frequency deviating from the frequency of the test signal and an arbitrary load on the secondary are determined using the simulation model.

12. The method of claim 11, wherein the plurality of parameters comprises a resistance $R_{ct}$ of the secondary winding, an eddy current resistance $R_{eddy}$, and a hysteresis curve that defines the variation of a voltage $V_c$ and the variation of a current $I_L$ in a main inductance of the transformer, the method further comprising:

determining a variation of an interlinked flux of the transformer with time as a function of frequency;

deriving, as a function of the variation of the interlinked flux, a voltage $V_c$ on the main inductance of the transformer; and deriving, as a function of time, a current $I_L$ in the main inductance of the transformer from the hysteresis curve, wherein a current $I_{ct}$ flowing in the secondary winding and a voltage $V_{ct}$ at the secondary winding are then determined for the particular frequency as follows:

$$I_{ct} = I_L + \frac{Vc}{R_{eddy}}$$

$$V_{ct} = V_c + I_{ct} \cdot R_{ct}.$$

13. The method of claim 1, wherein a non-sinusoidal test signal is used as the test signal.

14. The method of claim 13, wherein a square-wave signal is used as the test signal.

15. A test device for testing a transformer comprising:

a test signal source for applying a periodic test signal at different frequencies to a secondary of the transformer, a measuring device for measuring a plurality of parameters of the transformer with the test signal applied to the transformer, wherein eddy current resistance is one of the parameters of the transformer, and wherein power absorbed by the secondary of the transformer is determined to derive the eddy current resistance, and an evaluation device for evaluating the parameters and for deriving from the parameters a simulation model that simulates the behavior of the transformer at different frequencies;

whereby the behavior of the transformer during operation with a frequency deviating from the frequency of the test signal is predicted with the aid of the simulation model.

16. The test device of claim 15, wherein the measuring device and the evaluation device are integrated in a control unit which is constructed in the form of one or more of a controller, a computer, and a digital signal processor.

17. The test device of claim 15, wherein the test device further comprises:

at least one test signal output connectable to the secondary of the transformer, and a plurality of test inputs connectable to the secondary of the transformer for measuring the parameters of the transformer.

18. The test device of claim 15, wherein the test device is integrated into a portable instrument.

19. The test device of claim 15, wherein the test device has storage means for storing information comprising:
   the measured parameters of the transformer;
   the simulation model of the transformer; and
   information which describes the behavior of the transformer during operation at the frequency deviating from the frequency of the test signal.

20. The test device of claim 15, wherein the test device has an interface for transmitting information to an external device, The information selected from a group comprising (i) the measured parameters of the transformer, (ii) the simulation model of the transformer and, (iii) information which describes the behavior of the transformer during operation at the frequency deviating from the frequency of the test signal.

21. The test device of claim 15, wherein the test device further comprises an interface for receiving external control signals for automatic control of a test sequence implemented by the test device.

* * * * *

UNITED STATES PATENT AND TRADEMARK OFFICE
CERTIFICATE OF CORRECTION

PATENT NO. : 6,987,390 B2
DATED : January 17, 2006
INVENTOR(S) : Franz Süss, Michael Krüger and Friedrich Kaufmann It is certified that error appears in the above-identified patent and that said Letters Patent is hereby corrected as shown below:

<u>Title page,</u>
Item [73], Assignee, replace "AU" with -- AT --.

Signed and Sealed this

Eighteenth Day of April, 2006

JON W. DUDAS
*Director of the United States Patent and Trademark Office*